United States Patent
Yoshida

(10) Patent No.: US 8,310,750 B2
(45) Date of Patent: Nov. 13, 2012

(54) WAVEFORM SHAPING CIRCUIT AND OPTICAL SWITCHING DEVICE

(75) Inventor: Setsuo Yoshida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/947,909

(22) Filed: Nov. 17, 2010

(65) Prior Publication Data

US 2011/0063043 A1    Mar. 17, 2011

Related U.S. Application Data

(63) Continuation of application No. PCT/JP2008/061861, filed on Jun. 30, 2008.

(51) Int. Cl.
*H01S 3/10*    (2006.01)
*H01S 5/02*    (2006.01)
*G02F 1/01*    (2006.01)
*H03K 5/12*    (2006.01)

(52) U.S. Cl. ....... 359/344; 359/237; 372/38.1; 327/170; 327/182; 327/567; 330/185

(58) Field of Classification Search ............... 359/237, 359/344; 372/38.1; 330/185; 327/170, 182, 327/567

See application file for complete search history.

(56) References Cited

U.S. PATENT DOCUMENTS

| | | | |
|---|---|---|---|
| 5,412,339 A | 5/1995 | Takano | |
| 7,898,341 B2 * | 3/2011 | Ueno et al. | 330/308 |
| 7,912,379 B2 * | 3/2011 | Hase et al. | 398/197 |
| 8,031,750 B2 * | 10/2011 | Li et al. | 372/29.021 |
| 2002/0158659 A1 | 10/2002 | Suzuki et al. | |
| 2009/0058534 A1 * | 3/2009 | Ueno et al. | 330/302 |

FOREIGN PATENT DOCUMENTS

| | | |
|---|---|---|
| JP | 59-137867 | 8/1984 |
| JP | 02-075220 | 3/1990 |
| JP | 05-129916 | 5/1993 |
| JP | 6-61836 | 3/1994 |
| JP | 6-350362 | 12/1994 |
| JP | H6-350362 A | 12/1994 |
| JP | 8-107325 | 4/1996 |
| JP | 10-4319 | 1/1998 |
| JP | H10-004319 A | 1/1998 |

(Continued)

OTHER PUBLICATIONS

John Markus. Sourcebook of Electronic Circuits. Publisher: McGraw-Hill, Inc.; 1St Edition (Jan. 1, 1968). Language: English. ISBN-10: 0070404437. ISBN-13: 978-0070404434.*

(Continued)

*Primary Examiner* — Mark Hellner
*Assistant Examiner* — Ari M Diacou
(74) *Attorney, Agent, or Firm* — Staas & Halsey LLP

(57) ABSTRACT

A waveform shaping circuit enhances a rise of a waveform of a voltage applied to a load and includes an input unit to which the voltage is input; a supply unit configured to apply the voltage input from the input unit to the load; a first resistor connected in series between the input unit and the supply unit; a second resistor branch-connected to a portion between the input unit and the supply unit; and a stub connected to the first resistor or the second resistor and including a transmission path of a given length configured to shuttle the voltage by transmitting and reflecting the voltage as a voltage wave.

12 Claims, 11 Drawing Sheets

FOREIGN PATENT DOCUMENTS

| | | |
|---|---|---|
| JP | 11-004149 | 1/1999 |
| JP | 2000-002503 | 1/2000 |
| JP | 2001-154160 | 6/2001 |
| JP | 2001-154160 A | 6/2001 |
| JP | 2002-270773 | 9/2002 |
| JP | 2005-229402 | 8/2005 |
| JP | 2005-229402 A | 8/2005 |

OTHER PUBLICATIONS

International Preliminary Report on Patentability, mailed Jan. 13, 2011, in corresponding International Application No. PCT/JP2008/061861 (5 pp.).

International Search Report, mailed Jul. 22, 2008, in corresponding International Application PCT/JP2008/061861 (3 pp.).

Form PCT/ISA/220, mailed Jul. 22, 2008, in corresponding International Application PCT/JP2008/061861 (1 pg.).

Form PCT/ISA/237, mailed Jul. 22, 2008, in corresponding International Application PCT/JP2008/061861 (3 pp.).

English Translation of the International Preliminary Report on Patentability mailed Feb. 17, 2011 in corresponding International Patent Application PCT/JP2008/061861.

"Transistor technique SPECIAL No. 47", CQ Publishing Co., Ltd., Sep. 1, 1994 (figures 15, 16, 28, 29).

Japanese Office Action for corresponding Japanese Application 2010-518842; mailed Jun. 19, 2012.

\* cited by examiner

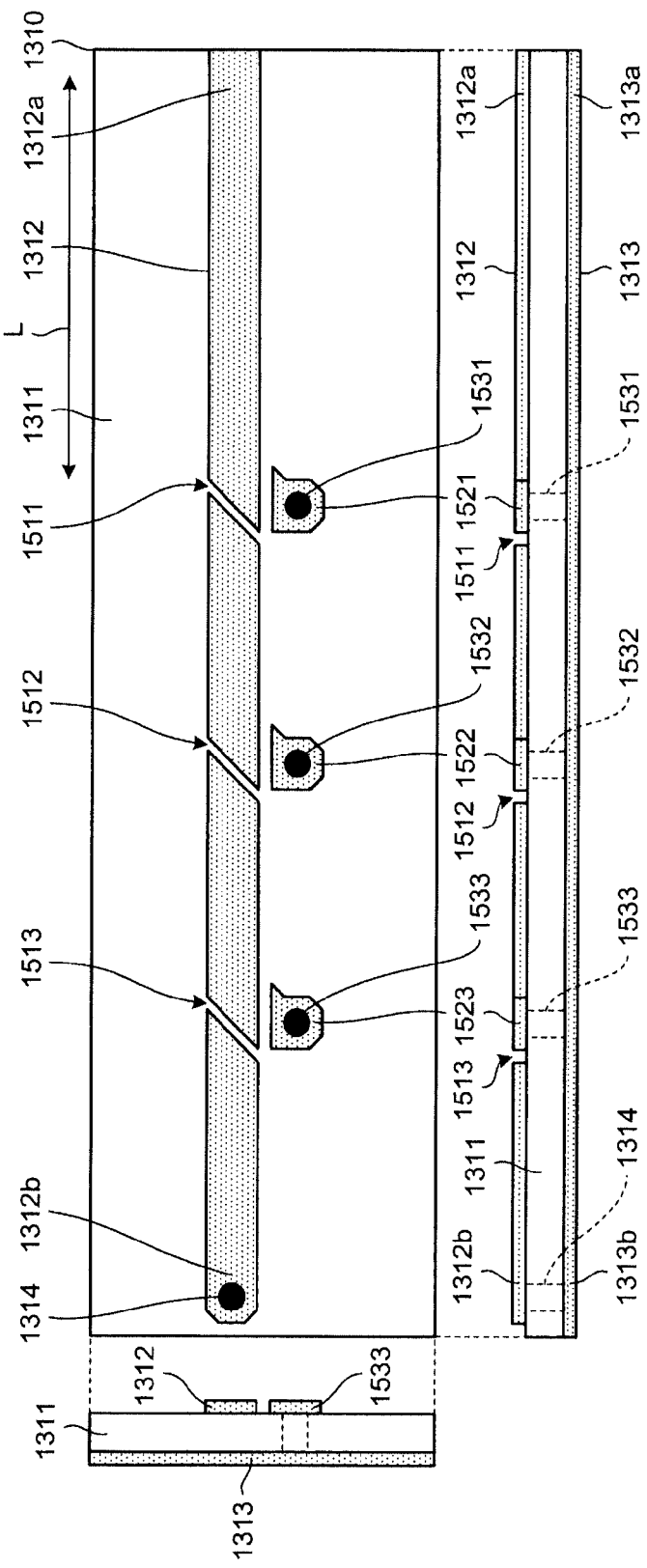

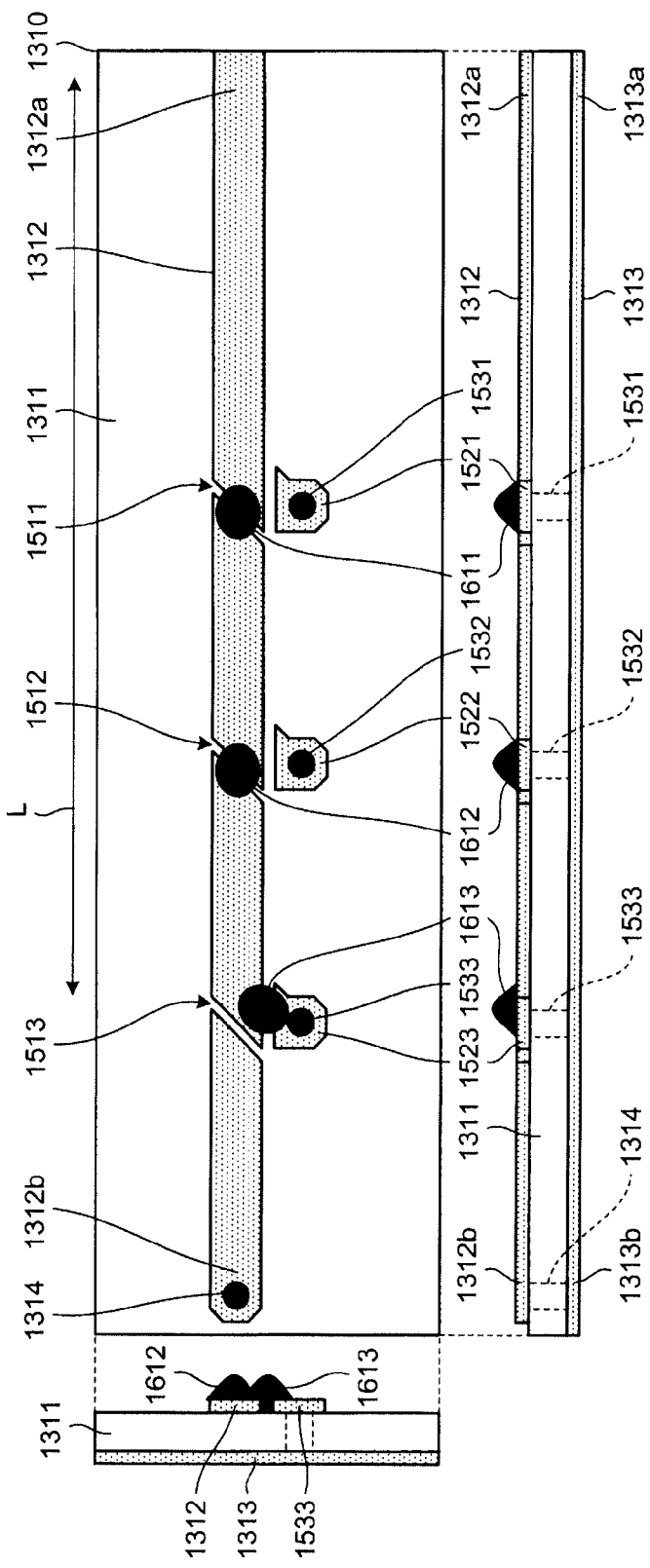

US 8,310,750 B2

WAVEFORM SHAPING CIRCUIT AND OPTICAL SWITCHING DEVICE

CROSS REFERENCE TO RELATED APPLICATION

This is a continuation application of PCT/JP2008/061861 filed on Jun. 30, 2008, the contents of which are incorporated herein by reference.

FIELD

The embodiments discussed herein are related to a waveform shaping circuit and an optical switching device.

BACKGROUND

Semiconductor optical amplifiers (SOA) are conventionally used as optical switches, whereby the output of light from the SOA is switched OFF and ON by switching the drive current supplied to the SOA OFF and ON (see, for example, Japanese Laid-Open Patent Publication No. 2001-154160).

Also conventionally used are speed up circuits that are provided upstream of a load having reactance and that speed up the rise of current flowing through the load by shaping the waveform of the voltage applied to the load and enhancing the edge (the rising portion). A load having reactance is a load in which the rise of the flowing current is delayed with respect to the rise of the applied voltage.

An example of a speed up circuit is a speed up condenser connected in parallel with a resistor connected in series with the load (see, for example, Japanese Laid-Open Patent Publication No. 2005-229402). Another example of a speed up circuit is a speed up inductor connected in series with a resistor having a branched connection to the load.

However, the conventional speed up circuits described above cannot shape the rise of the waveform of the supplied current accurately due to variation in the self-resonant frequency of the condenser and/or the inductor. Specifically, the condenser has parasitic inductance due to manufacturing variation, and variation in the parasitic inductance causes variation in the period during which the applied voltage is enhanced. The inductor also has parasitic capacitance due to manufacturing variation, causing variation in the period during which the applied voltage is enhanced.

For example, when the load is an SOA used as an optical switch, the variation in the period during which the applied voltage is enhanced causes variation in the rise time, thereby preventing highly-accurate switching. Variation in the self-resonant frequency of the condenser or the inductor particularly affects the SOA since the supplied current is turned ON and OFF on the order of nanoseconds.

SUMMARY

According to an aspect of an embodiment, a waveform shaping circuit enhances a rise of a waveform of a voltage applied to a load and includes an input unit to which the voltage is input; a supply unit configured to apply the voltage input from the input unit to the load; a first resistor connected in series between the input unit and the supply unit; a second resistor branch-connected to a portion between the input unit and the supply unit; and a stub connected to the first resistor or the second resistor and including a transmission path of a given length configured to shuttle the voltage by transmitting and reflecting the voltage as a voltage wave.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 15 is a diagram of a variation of a short stub depicted in FIG. 13.

FIG. 16 is a diagram for explaining adjustment of the short stub depicted in FIG. 15.

DESCRIPTION OF EMBODIMENTS

Preferred embodiments of the present invention will be explained with reference to the accompanying drawings.

Preferred embodiments of the present invention will be explained with reference to the accompanying drawings.

Figure 1:
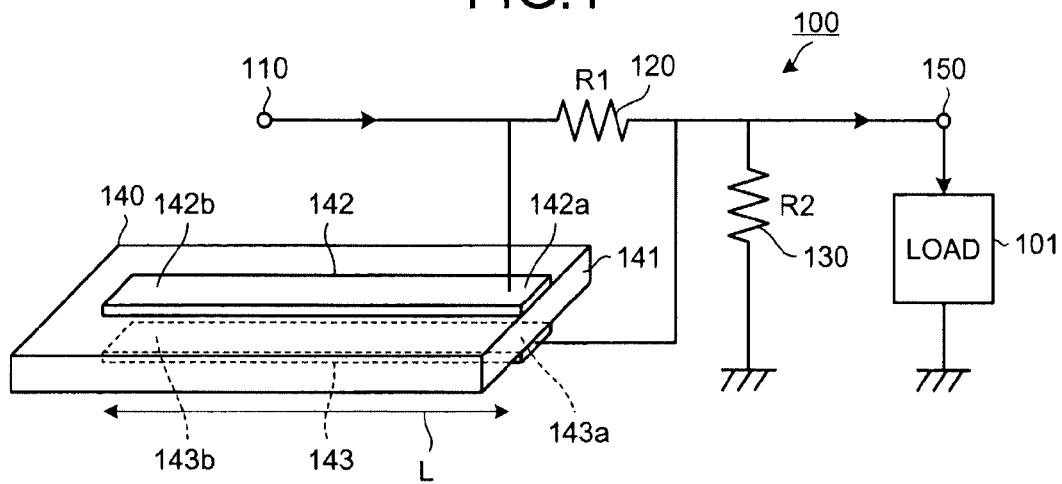
FIG. 1 is a diagram of a waveform shaping circuit according to a first embodiment.

FIG. 1 is a diagram of a waveform shaping circuit according to a first embodiment. As depicted in FIG. 1, a waveform shaping circuit 100 according to the first embodiment enhances the rise of the waveform of voltage applied to a load 101 downstream. The load 101 is, for example, an SOA that amplifies light according to the current supplied thereto. The waveform shaping circuit 100 includes an input unit 110, a first resistor 120, a second resistor 130, an open stub 140, and a supply unit 150.

Voltage to be applied to the load 101 is input to the input unit 110. For example, the voltage is turned ON and OFF by a switching circuit (not shown) provided upstream of the input unit 110. When the load 101 is an SOA, the load 101 is used as an optical switch that turns ON and OFF light input from an external source.

The first resistor 120 is connected in series between the input unit 110 and the supply unit 150. In other words, an end of the first resistor 120 is connected to the input unit 110, while the other end is connected to the supply unit 150. An end of the second resistor 130 is branch-connected to a portion between the input unit 110 and the supply unit 150. Here, the end of the second resistor 130 is branched-connected to a portion between the first resistor 120 and the supply unit 150. The other end of the second resistor 130 is grounded.

The open stub 140 is connected in parallel to the first resistor 120. Specifically, the open stub 140 includes a substrate 141, a first transmission path 142, and a second transmission path 143. The substrate 141 is a dielectric substrate such as $SiO_2$. The first transmission path 142 and the second transmission path 143 are formed on the surface of the substrate 141 by patterning so as to face each other having the substrate 141 therebetween.

An end 142a of the first transmission path 142 and an end 143a of the second transmission path 143 are provided so as to face each other. The other end 142b of the first transmission path 142 and the other end 143b of the second transmission path 143 are provided so as to face each other. The end 142a of the first transmission path 142 is connected to the input-unit-side of the first resistor 120. The end 143a of the second transmission path 143 is connected to the supply-unit-side of the first resistor 120.

The first transmission path 142 shuttles a voltage wave input from the input unit 110 by transmitting and reflecting the voltage wave. Specifically, the voltage wave input from the end 142a of the first transmission path 142 is transmitted through the first transmission path 142 and reflected at the other end 142b to return to the end 142a. The effective length L is the length (a given length) of a portion of the first transmission path 142 where the voltage wave is shuttled. The first transmission path 142 is designed to have characteristic impedance that is lower than the resistance R1 of the first resistor 120.

A configuration in which the first transmission path 142 and the second transmission path 143 are formed on the surface of the substrate 141 by patterning has been described above; however, the open stub 140 may be any stub of which characteristic impedance is adjustable, such as a coaxial cable. The supply unit 150 applies to the load 101, the voltage input from the input unit 110. A configuration of the waveform shaping circuit 100 has been described above; however, the waveform shaping circuit 100 and the load 101 that is an SOA may be configured as an integrated optical switching device.

Figure 2:
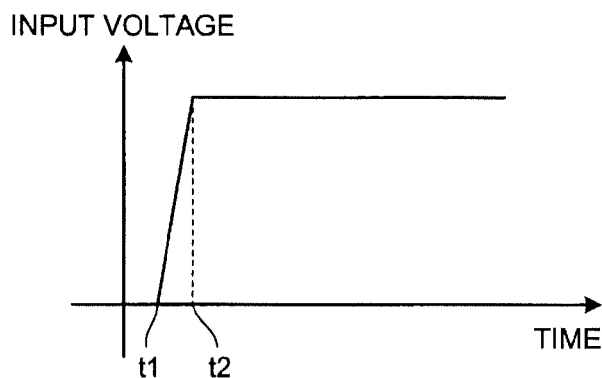
FIG. 2 is a diagram of a waveform of voltage input to an input unit depicted in FIG. 1.

FIG. 2 is a diagram of a waveform of the voltage input to the input unit depicted in FIG. 1. In FIG. 2, the horizontal axis represents time, while the vertical axis represents the voltage (the input voltage) input to the input unit 110 depicted in FIG. 1. FIG. 2 depicts an edge (a rising portion) of the voltage input to the input unit 110. The voltage input to the input unit 110 is OFF before time t1, and becomes ON at time t1.

Specifically, the voltage input to the input unit 110 rapidly increases from time t1 to time t2 after time t1, and remains ON at time t2 and thereafter. Specifically, the voltage input to the input unit 110 is stabilized at a constant value at time t2 and thereafter.

Figure 3:
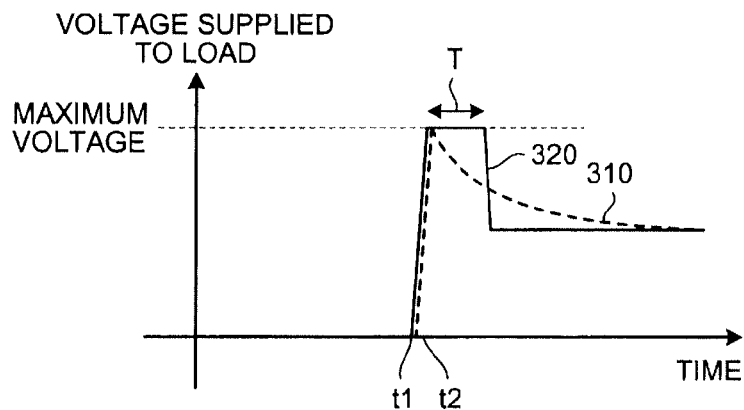
FIG. 3 is a diagram of a waveform of voltage applied to load from a supply unit depicted in FIG. 1.

FIG. 3 is a diagram of a waveform of the voltage applied to the load from the supply unit depicted in FIG. 1. In FIG. 3, the horizontal axis represents time and corresponds to t1 and t2 on the horizontal axis of FIG. 2, while the vertical axis represents the voltage applied to the load 101 from the supply unit 150 depicted in FIG. 1 (the applied voltage to the load). A dotted line 310 represents the waveform of the voltage applied to the load 101 when a conventional waveform shaping circuit with a speed up condenser is assumed to be used.

As indicated by the dotted line 310, with the conventional waveform shaping circuit, the voltage starts decreasing immediately after the edge of the voltage is enhanced to the maximum voltage. A solid line 320 represents the waveform of the voltage applied to the load 101 from the waveform shaping circuit 100. As indicated by the solid line 320, with the waveform shaping circuit 100 the edge of the voltage remains enhanced at the maximum voltage for a period T.

After the period T has elapsed, the voltage applied to the load 101 from the supply unit 150 of the waveform shaping circuit 100 rapidly decreases to a constant voltage, and is stabilized at the constant voltage. The period T corresponds to a period for the voltage input from the end 142a of the first transmission path 142 to be reflected at the other end 142b of the first transmission path 142 and to return to the end 142a. Thus, the period T can be adjusted by changing the effective length L (see FIG. 1) of the first transmission path 142.

The effective length L can be finely adjusted by, for example, a setting for forming the first transmission path 142 on the substrate 141. Since the period T is determined by the effective length L of the first transmission path 142, the length of the second transmission path 143 need not be adjusted if the second transmission path 143 is provided so as to face the first transmission path 142.

The effective length L is adjusted according to the characteristic of the load 101. For example, when the load 101 is an SOA, the effective length L is adjusted such that time from the rise of the applied voltage to the rise of the amplification characteristic of the SOA coincides with the period T. The rise of the amplification characteristic means a state in which the light output from the SOA is ON fully.

Figure 4:
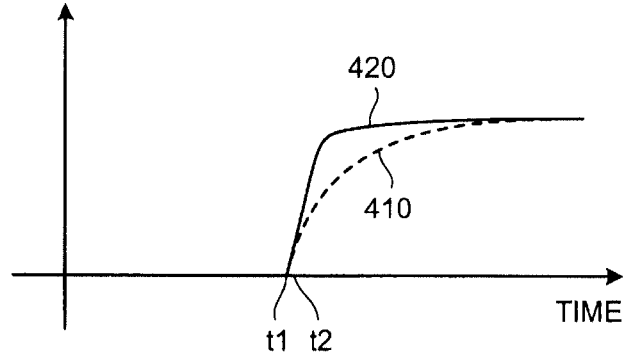
FIG. 4 is a diagram of the waveform of current that flows through the load.

FIG. 4 is a diagram of the waveform of current that flows through the load. In FIG. 4, the horizontal axis represents time and corresponds to t1 and t2 on the horizontal axes of FIGS. 2 and 3, while the vertical axis represents the current that flows through the load 101 depicted in FIG. 1. A dotted line 410 represents the waveform of the current that flows through the load 101 when a speed up condenser is assumed to be used.

A solid line 420 represents the waveform of the current that is supplied from the supply unit 150 of the waveform shaping circuit 100 and that flows through the load 101. As depicted in FIG. 4, the period from when the current input to the input unit 110 becomes ON (time t1) to when the current that flows through the load 101 becomes the maximum voltage is shorter for the waveform shaping circuit 100 (solid line 420) than for the conventional waveform shaping circuit (dotted line 410).

Figure 5:
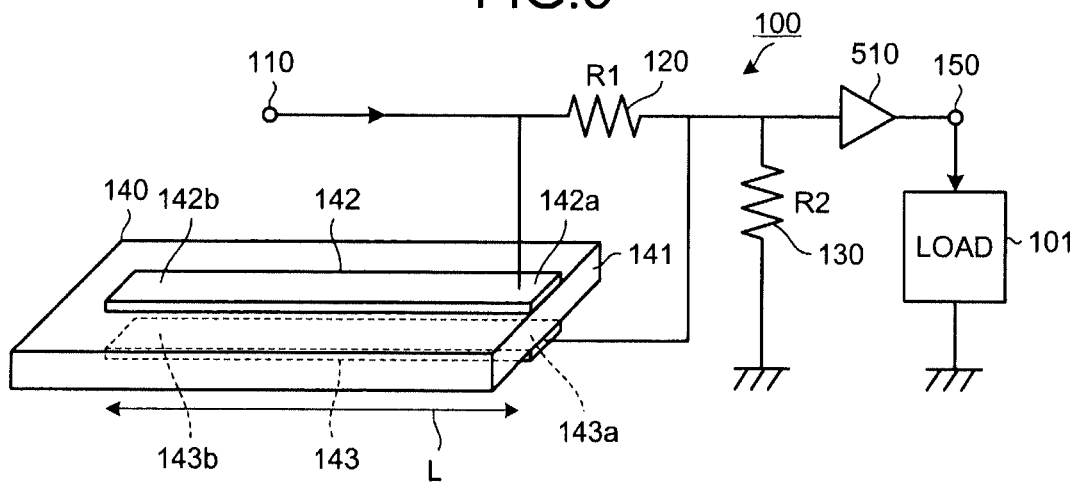
FIG. 5 is a diagram of a first variation of the waveform shaping circuit depicted in FIG. 1.

FIG. 5 is a diagram of a first variation of the waveform shaping circuit depicted in FIG. 1. In FIG. 5, components similar to those depicted in FIG. 1 are assigned the same reference numerals respectively used in FIG. 1, and description thereof is omitted. The waveform shaping circuit 100 may include an amplifier 510 in addition to the components depicted in FIG. 1. The amplifier 510 is provided downstream of the first resistor 120 and the second resistor 130, and upstream of the supply unit 150.

The supply unit 150 supplies the current amplified by the amplifier 510 to the load 101. When the load 101 is an SOA, a large current needs to flow from the supply unit 150 to the load 101. A large current is, for example, 0.3 A. Even when the current upstream of the supply unit 150 is small, the SOA can be operated by amplifying the current output to the supply unit 150 by the amplifier 510 to, for example, 0.3 A.

Thus, the SOA can be operated without using any specific, high-current-tolerant part in the input unit 110, the first resistor 120, the second resistor 130, the open stub 140, and the supply unit 150, thereby improving the tolerance of the waveform shaping circuit 100 to a large current as well as reducing cost.

Figure 6:
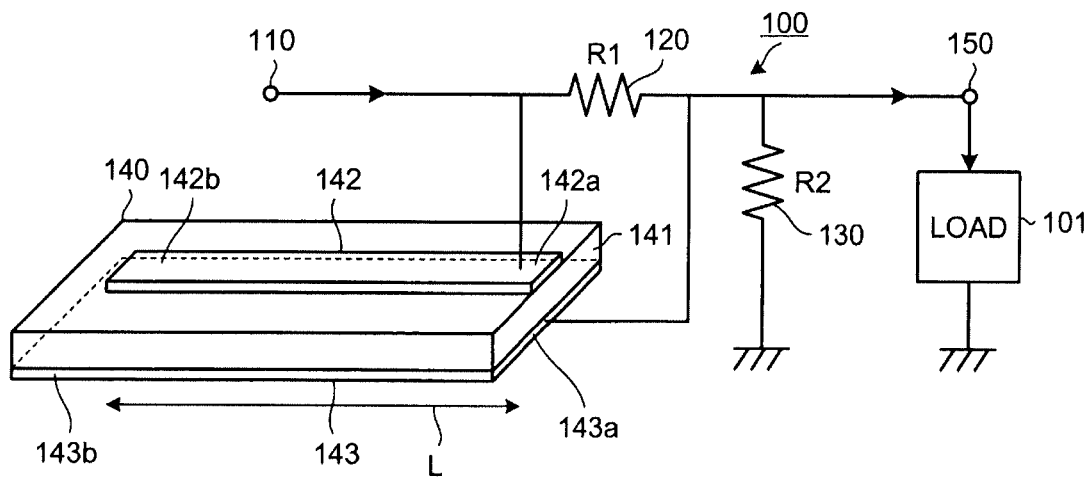
FIG. 6 is a diagram of a second variation of the waveform shaping circuit depicted in FIG. 1.

FIG. 6 is a diagram of a second variation of the waveform shaping circuit depicted in FIG. 1. In FIG. 6, components similar to those depicted in FIG. 1 are assigned the same reference numerals respectively used in FIG. 1, and description thereof is omitted. In the configuration of the waveform shaping circuit 100 depicted in FIG. 1, the second transmission path 143 may be provided on the entire bottom surface of the substrate 141. Similar to the configuration depicted in FIG. 1, the voltage applied to the load 101 from the supply unit 150 in this case has the same waveform as that depicted in FIG. 3. Accordingly, the current that flows through the load 101 has the same waveform as that depicted in FIG. 4.

An example of design values for each circuit in this configuration is described. The first resistor 120 has a resistance R1 of 400Ω; the second resistor 130 has a resistance R2 of 400Ω; the substrate 141 has a relative permittivity εr of 9; and the substrate 141 has a thickness of 1.5 mm. The first transmission path 142 is designed to have a characteristic impedance that is lower than the resistance R1 of the first resistor 120.

Thus, the open stub 140 functions as a resistor having a lower resistance than the first resistor 120 during the period when the voltage wave shuttles along the first transmission path 142. Consequently, the end voltage of the first resistor 120 decreases while the end voltage of the second resistor 130 increases. After the voltage wave has shuttled along the first transmission path 142, the open stub 140 functions as an insulator. Consequently, the end voltage of the first resistor 120 increases, while the end voltage of the second resistor 130 decreases and is stabilized. Thus, the voltage applied to the load 101 is enhanced during the period (the period T) when the voltage wave shuttles along the first transmission path 142.

Here, the characteristic impedance of the first transmission path 142 is 100Ω; the width of electrodes of the first transmission path 142 is 0.2 mm; and the effective length L of the first transmission path 142 is 6.6 cm. In this case, the time required for the voltage wave to shuttle along the first transmission path 142 is about 1 ns. Accordingly, the period T during which the voltage waveform is enhanced is about 1 ns.

Figure 7:
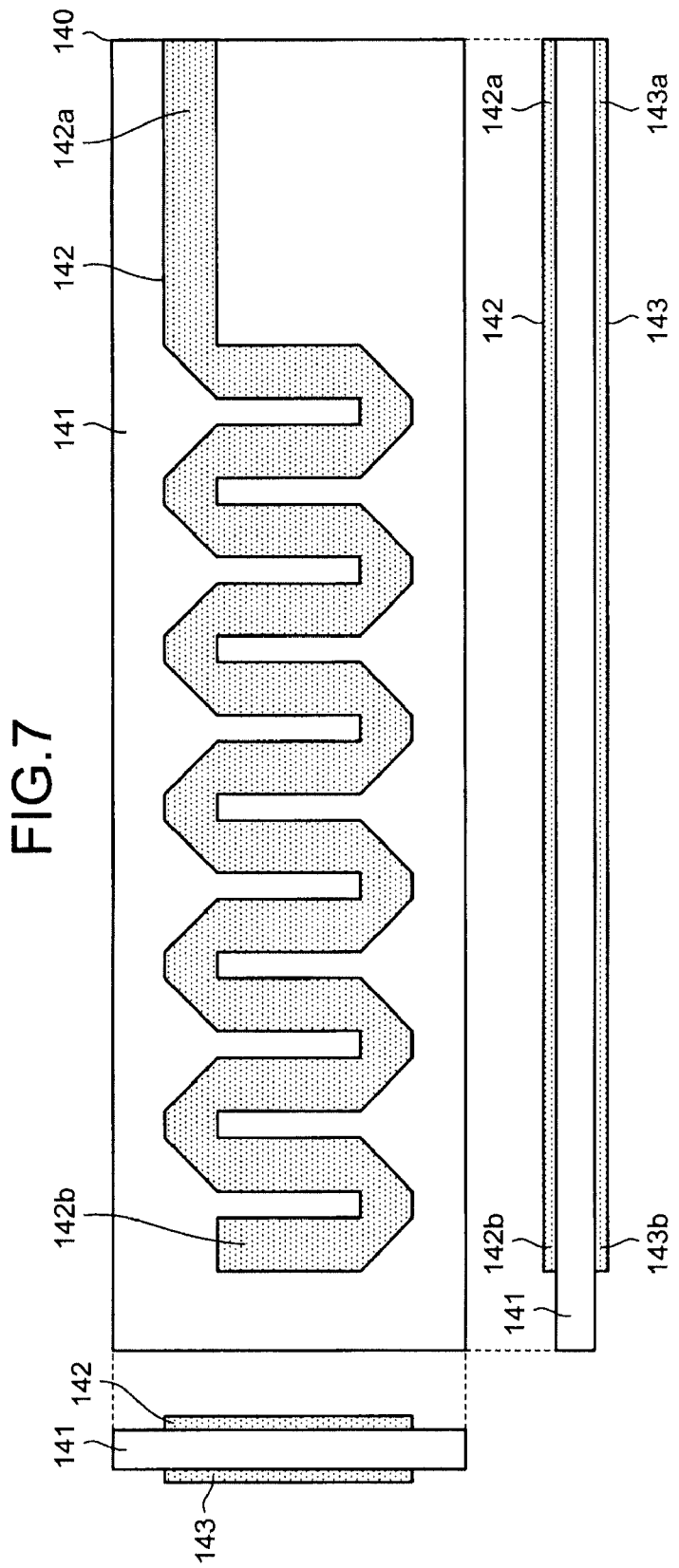
FIG. 7 is a diagram of a first variation of an open stub depicted in FIG. 1.

FIG. 7 is a diagram of a first variation of the open stub depicted in FIG. 1. In FIG. 7, components similar to those depicted in FIG. 1 are assigned the same reference numerals respectively used in FIG. 1, and description thereof is omitted. FIG. 7 depicts a plan view, a front view, and a side view of the open stub 140 (the same applies to FIGS. 8 to 12). In the open stub 140 depicted in FIG. 7, the first transmission path 142 is formed so as to snake along the surface of the substrate 141.

Thus, the effective length L of the first transmission path 142 can be increased without making the substrate 141 long and large. Consequently, the time required for the voltage wave to shuttle along the first transmission path 142 can be increased without making the open stub 140 long and large, thereby setting a longer period (see the period T of FIG. 3) during which the rise of the edge of the voltage applied to the load 101 is enhanced.

Figure 8:
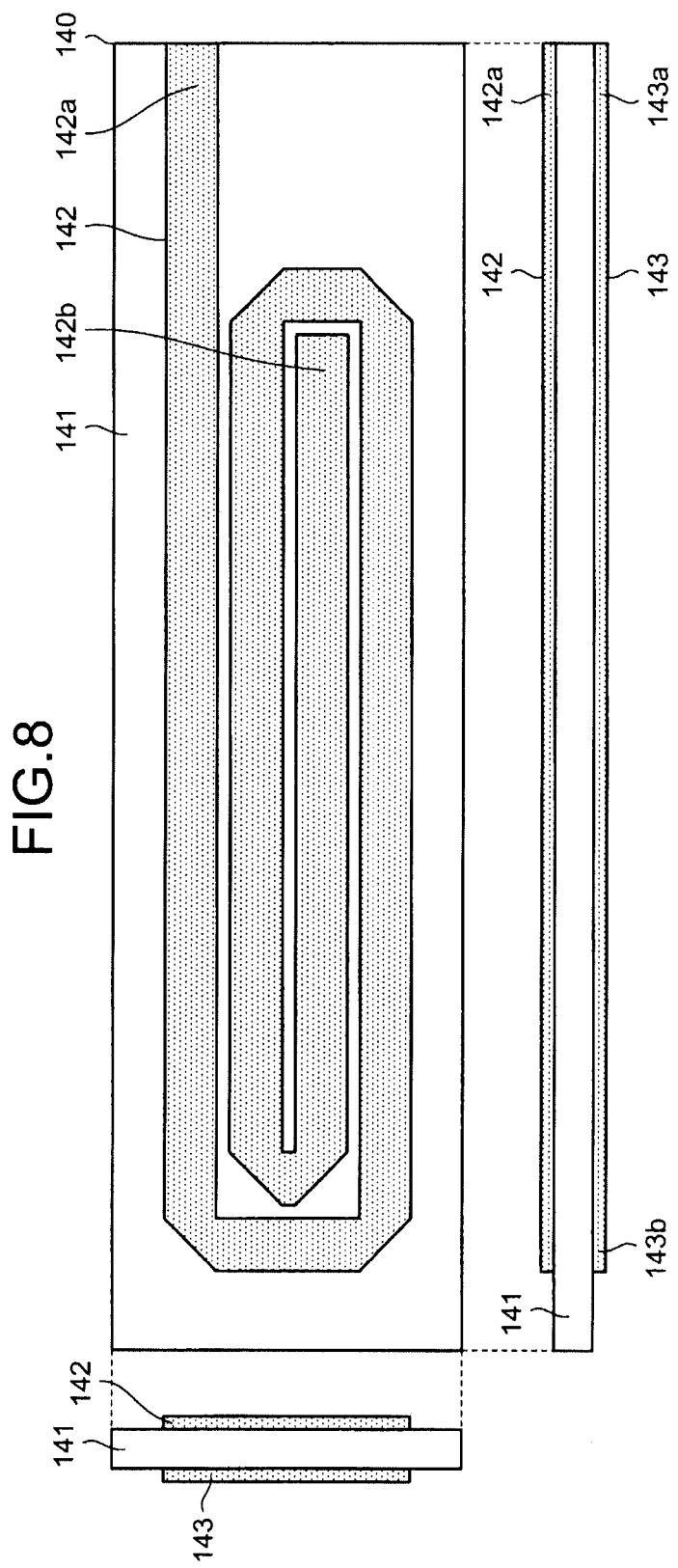
FIG. 8 is a diagram of a second variation of the open stub depicted in FIG. 1.

FIG. 8 is a diagram of a second variation of the open stub depicted in FIG. 1. In FIG. 8, components similar to those depicted in FIG. 1 are assigned the same reference numerals respectively used in FIG. 1, and description thereof is omitted. In the open stub 140 depicted in FIG. 8, the first transmission path 142 is formed so as to spiral along the surface of the substrate 141. Thus, similar to the configuration depicted in FIG. 7, the effective length L of the first transmission path 142 can be increased without making the substrate 141 long and large.

Figure 9:
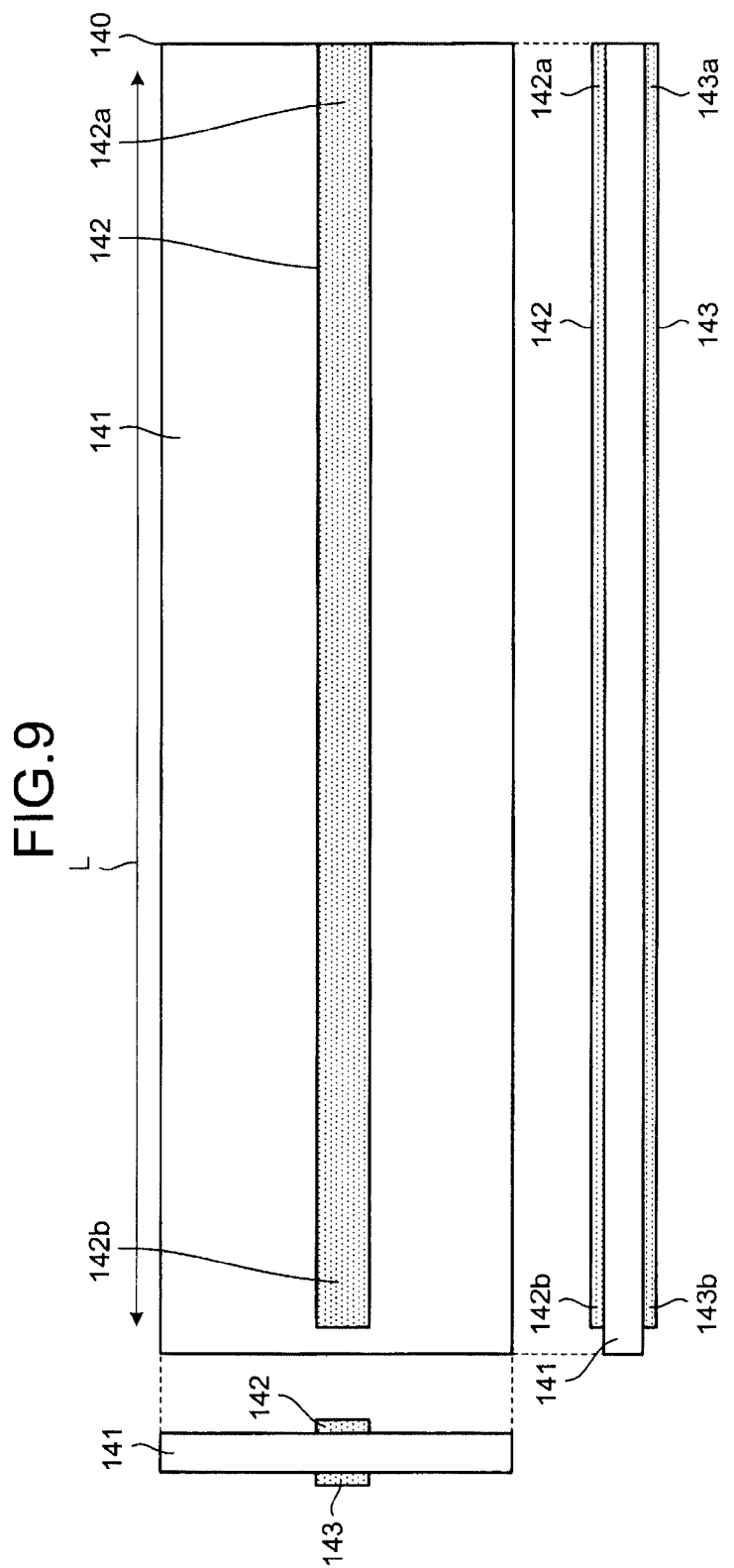
FIG. 9 is a first diagram for explaining adjustment of the open stub depicted in FIG. 1.

FIG. 9 is a first diagram for explaining adjustment of the open stub depicted in FIG. 1. In FIG. 9, components similar to those depicted in FIG. 1 are assigned the same reference numerals respectively used in FIG. 1, and description thereof is omitted. As depicted in FIG. 9, the first transmission path 142 is formed so as to have a sufficient effective length L. A sufficient length of the first transmission path 142 is an effective length L of the first transmission path 142 that makes the period T described above longer than a desired period.

Figure 10:
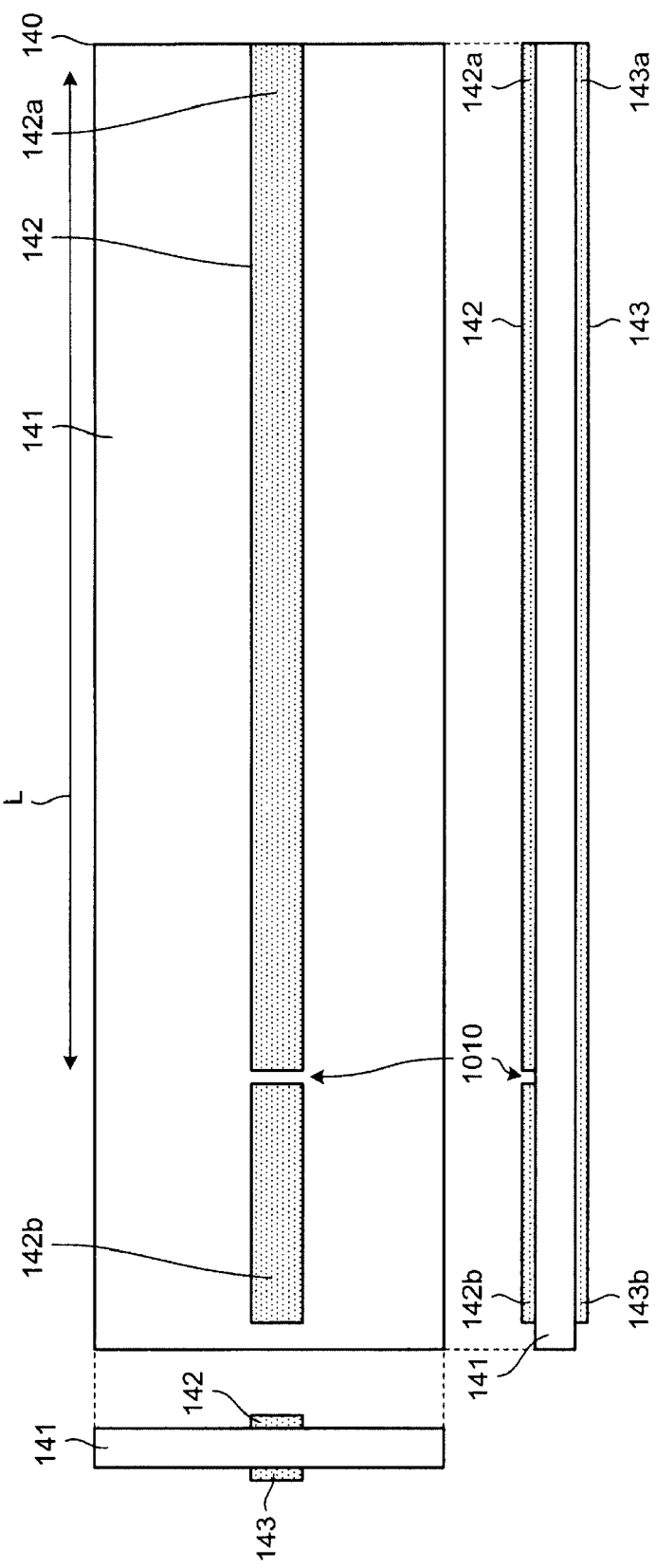
FIG. 10 is a second diagram for explaining adjustment of the open stub depicted in FIG. 1.

FIG. 10 is a second diagram for explaining adjustment of the open stub depicted in FIG. 1. From the state depicted in FIG. 9, the first transmission path 142 is cut by laser beam, etc. to the state depicted in FIG. 10. Here, a portion 1010 near the other end 142b of the first transmission path 142 is cut out. In this case, the voltage wave input from the end 142a of the first transmission path 142 is transmitted through the first transmission path 142, reflected where the portion 1010 has been cut out, and returns to the end 142a.

Thus, the effective length L of the first transmission path 142 is reduced, and the time required for the voltage wave to shuttle along the first transmission path 142 is reduced. Thus, the period T described above is shortened. In this state, if the period T is still longer than the desired period, the first transmission path 142 is further cut to reduce the effective length L of the first transmission path 142, as explained with reference to FIG. 11.

Figure 11:
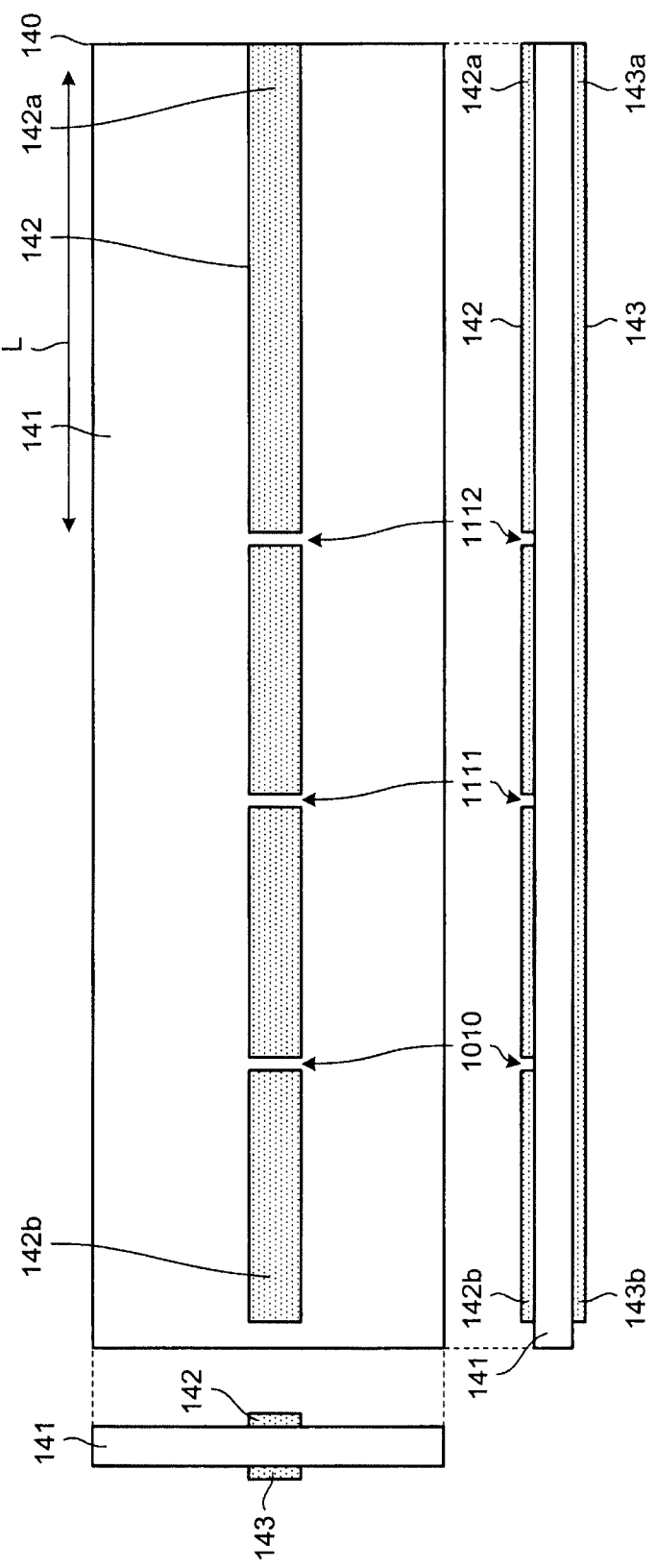
FIG. 11 is a third diagram for explaining adjustment of the open stub depicted in FIG. 1.

FIG. 11 is a third diagram for explaining adjustment of the open stub depicted in FIG. 1. If in the state depicted in FIG. 10, the period T is still longer than the desired period, the effective length L of the first transmission path 142 is reduced by sequentially cutting the first transmission path 142 as depicted in FIG. 11. Here, a portion 1111 of the first transmission path 142 is cut out, and then a portion 1112 is cut out.

In this case, the voltage wave input from the end 142a of the first transmission path 142 is transmitted through the first transmission path 142, reflected where the portion 1112 has been cut out, and returns to the end 142a. Thus, the effective length L of the first transmission path 142 is further reduced and the time required for the voltage wave to shuttle along the first transmission path 142 is further reduced. Thus, the period T described above is further shortened.

As depicted in FIGS. 9 to 11, the period T during which the rise of the edge of the voltage applied to the load 101 is enhanced, can be shortened by sequentially cutting the first transmission path 142. The adjustment of the open stub 140 as depicted in FIGS. 9 to 11 is performed with the waveform of the current output from the supply unit 150 (see FIG. 4) being monitored by a current monitor provided downstream of the supply unit 150. When the load 101 is an SOA, the adjustment may be performed with the light output from the SOA being monitored by an optical monitor.

Figure 12:
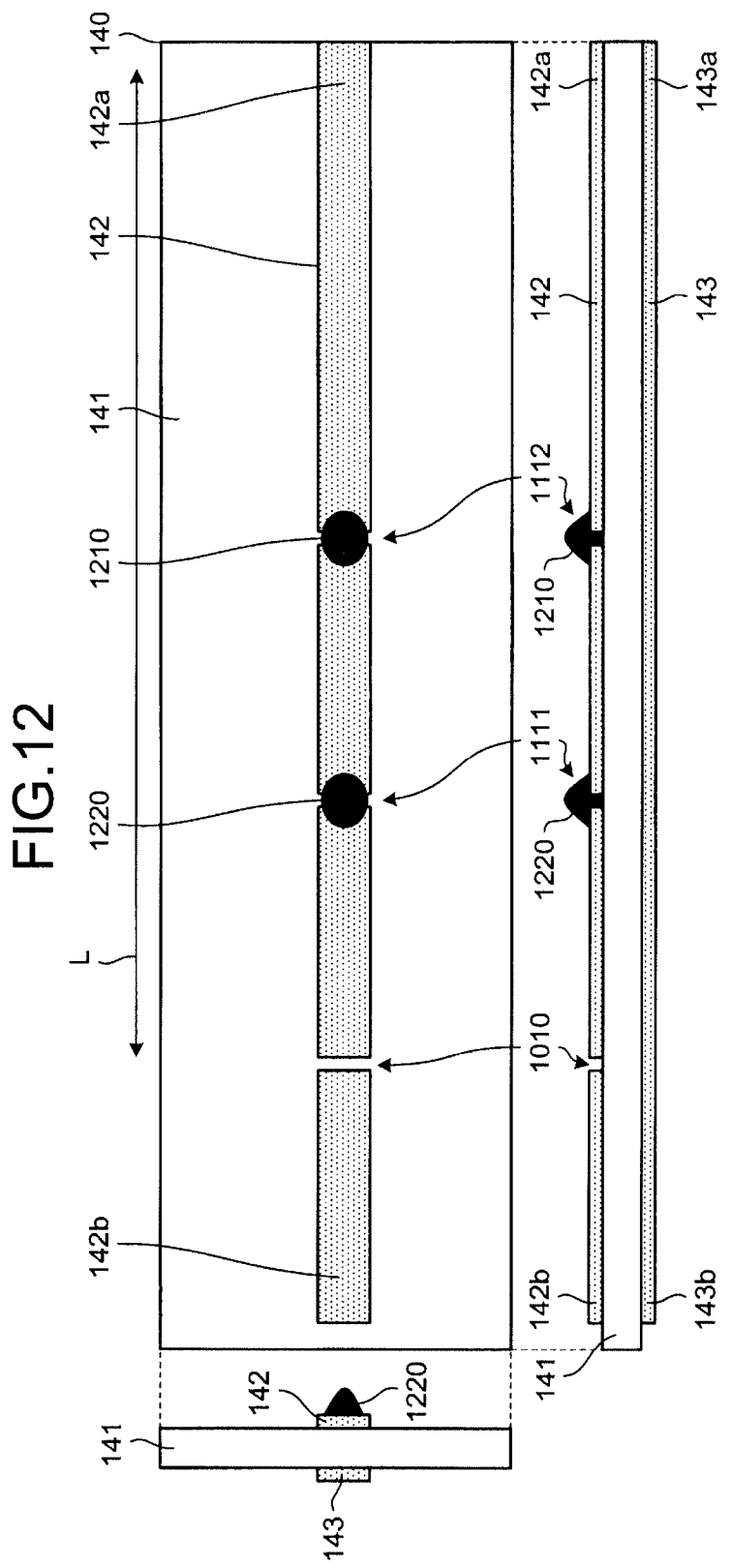
FIG. 12 is a fourth diagram for explaining adjustment of the open stub depicted in FIG. 1.

FIG. 12 is a fourth diagram for explaining adjustment of the open stub depicted in FIG. 1. From the state depicted in FIG. 11, the effective length L of the first transmission path 142 may be increased. For example, as depicted in FIG. 12, the first transmission path 142 is electrically connected by a solder bridge 1210 where the portion 1112 has been cut out. In this case (not shown), the voltage wave input from the end 142a of the first transmission path 142 is transmitted through the first transmission path 142, reflected where the portion 1111 has been cut out, and returns to the end 142a.

Thus, the effective length L of the first transmission path 142 can be increased. The first transmission path 142 may be connected by a solder bridge 1220 where the portion 1111 has been cut out, whereby the voltage wave input from the end 142*a* of the first transmission path 142 is transmitted through the first transmission path 142, reflected where the portion 1010 has been cut out, and returns to the end 142*a*. Thus, the effective length L of the first transmission path 142 can be further increased.

An example in which the effective length L of the first transmission path 142 is reduced until the period T is of a desired length has been described; however, the effective length L of the first transmission path 142 can be increased until the period T is of a desired length. For example, the first transmission path 142 is formed on the substrate 141 in the shape depicted in FIG. 11. In this case, the first transmission path 142 is sequentially connected by solder bridges (connecting members) where the portions have been cut out, until the period T is of a desired length.

Thus, the waveform shaping circuit 100 according to the first embodiment implements a speed up circuit that enhances the rising portion of the voltage waveform by the open stub 140 that is free of the variation in the self-resonant frequency, thereby reducing the variation in the rise time of the current waveform caused by the variation in the self-resonant frequency of the speed up circuit.

Further, the voltage waveform can be enhanced during the period when the voltage wave shuttles along the first transmission path 142. Thus, the period T during which the voltage waveform is enhanced can be lengthened, and the enhancement time T of the voltage waveform can be accurately adjusted by adjusting the length of the first transmission path 142. Consequently, the rise of the waveform of the supplied current can be accurately shaped.

For example, when the load 101 is an SOA used as an optical switch, variation in the rise of the SOA can be reduced by reducing the variation in the rise time of the current waveform. Consequently, an optical switching device having less variation in optical switching time can be achieved.

Further, the period T during which the voltage waveform is enhanced is not an instant as in the conventional art, but continues for a period according to the effective length L of the first transmission path 142. Thus, the rise of the current that flows through the load 101 can be speeded up (see FIG. 4). For example, when the overshoot of the applied voltage is 200%, the waveform shaping circuit 100 can speed up the rise of the current that flows through the load 101 by 20% to 30% compared to the conventional waveform shaping circuit.

Further, since the period T during which the voltage waveform is enhanced can be lengthened, the voltage waveform during the rise of the current that flows through an SOA can be enhanced even when the SOA has a slow rise characteristic of current with respect to the applied voltage, thereby speeding up the rise of the current that flows through the SOA.

Figure 13:
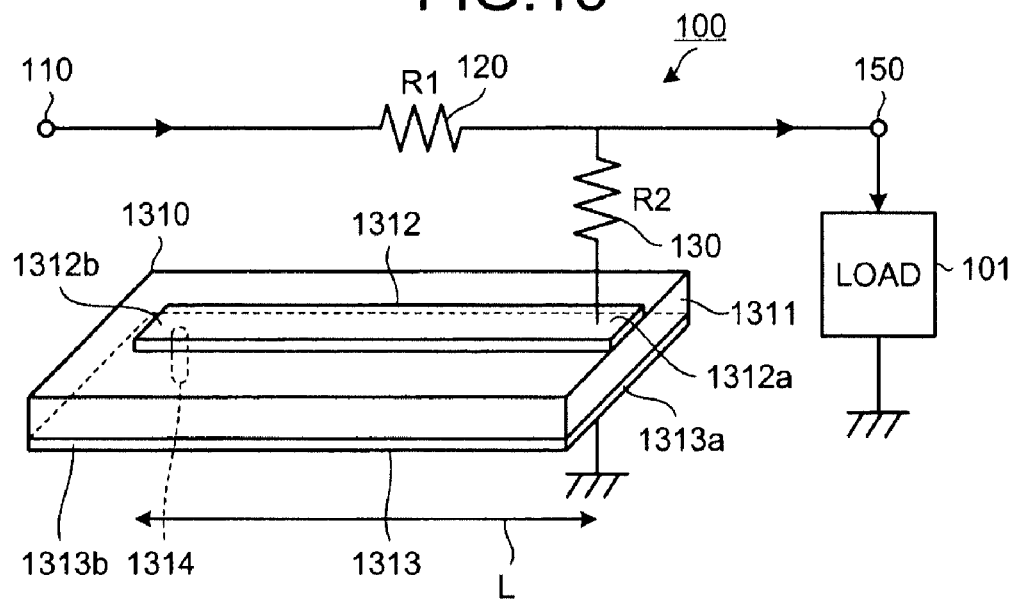
FIG. 13 is a diagram of a waveform shaping circuit according to a second embodiment.

FIG. 13 is a diagram of a waveform shaping circuit according to a second embodiment. In FIG. 13, components similar to those depicted in FIG. 1 are assigned the same reference numerals respectively used in FIG. 1, and description thereof is omitted. As depicted in FIG. 13, the waveform shaping circuit 100 according to the second embodiment includes a short stub 1310 instead of the open stub 140 depicted in FIG. 1. The short stub 1310 is connected in series with the second resistor 130.

Specifically, the short stub 1310 includes a substrate 1311, a first transmission path 1312, a second transmission path 1313, and a via 1314. The substrate 1311 is a dielectric substrate such as $SiO_2$. The first transmission path 1312 and the second transmission path 1313 are formed on the surface of the substrate 1311 by patterning so as to face each other having the substrate 1311 therebetween.

An end 1312*a* of the first transmission path 1312 and an end 1313*a* of the second transmission path 1313 are provided so as to face each other. The other end 1312*b* of the first transmission path 1312 and the other end 1313*b* of the second transmission path 1313 are provided so as to face each other. The end 1312*a* of the first transmission path 1312 is connected to the second resistor 130.

An end 1313*a* of the second transmission path 1313 is grounded. The other end 1312*b* of the first transmission path 1312 and the other end 1313*b* of the second transmission path 1313 are connected by the via 1314 that passes through the substrate 1311. The first transmission path 1312 shuttles a voltage wave input from the input unit 110 by transmitting and reflecting the voltage wave.

Specifically, the voltage wave input from the end 1312*a* of the first transmission path 1312 is transmitted through the first transmission path 1312 and reflected at the other end 1312*b* of the first transmission path 1312 to return to the end 1312*a*. Similar to the open stub 140 depicted in FIG. 1, the second transmission path 1313 may have the same shape as the first transmission path 1312.

An example of design values for each circuit in this configuration is described. The first resistor 120 has a resistance R1 of 25Ω; the second resistor 130 has a resistance R2 of 25Ω; the substrate 1311 has a relative permittivity ∈r of 9; and the substrate 1311 has a thickness of 1.5 mm. The first transmission path 1312 is designed to have a higher characteristic impedance than the resistance R2 of the second resistor 130.

Thus, the short stub 1310 functions as a resistor having a higher resistance than the second resistor 130 during the period when the voltage wave shuttles along the first transmission path 1312. Consequently, the voltage between the end 1312*a* of the first transmission path 1312 and the end 1313*a* of the second transmission path 1313 increases, and the voltage applied to the load 101 increases. After the voltage wave has shuttled along the first transmission path 1312, the short stub 1310 functions as a conductor wire. Consequently, the voltage between the end 1312*a* of the first transmission path 1312 and the end 1313*a* of the second transmission path 1313 becomes substantially 0 V and is stabilized, and the voltage applied to the load 101 decreases. Thus, the voltage applied to the load 101 is enhanced.

Here, the characteristic impedance of the first transmission path 1312 is 100Ω; the width of electrodes of the first transmission path 1312 is 0.2 mm; and the effective length L of the first transmission path 1312 is 6.6 cm. In this case, the time required for the voltage wave to shuttle along the first transmission path 1312 is about 1 ns. Accordingly, the period T during which the voltage waveform is enhanced is about 1 ns.

The waveform of the voltage input to the input unit 110 (see FIG. 2), the waveform of the voltage applied to the load 101 from the supply unit 150 (see FIG. 3), and the current that flows through the load 101 (see FIG. 4) are the same as for the waveform shaping circuit 100 depicted in FIG. 1, and description thereof is omitted. A configuration of the waveform shaping circuit 100 has been described above; however, the waveform shaping circuit 100 and the load 101 that is an SOA may be configured as an integrated optical switching device.

Figure 14:
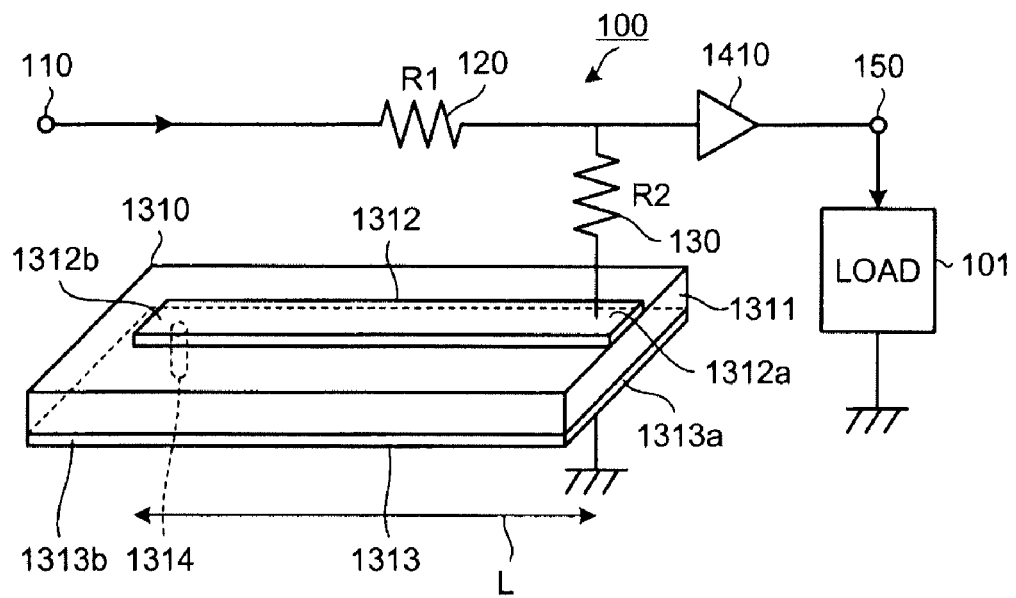
FIG. 14 is a diagram of a variation of the waveform shaping circuit depicted in FIG. 13.

FIG. 14 is a diagram of a variation of the waveform shaping circuit depicted in FIG. 13. In FIG. 14, components similar to those depicted in FIG. 13 are assigned the same reference numerals respectively used in FIG. 13, and description thereof is omitted. The waveform shaping circuit 100 depicted in FIG. 14 includes an amplifier 1410 in addition to the components depicted in FIG. 13. The amplifier 1410 is provided downstream of the first resistor 120 and the second resistor 130, and upstream of the supply unit 150. The operation and the effect of the amplifier 1410 are the same as the amplifier 510 depicted in FIG. 5, and description thereof is omitted (see the description of FIG. 5).

FIG. 15 is a diagram of a variation of the short stub depicted in FIG. 13. In FIG. 15, components similar to those depicted in FIG. 13 are assigned the same reference numerals respectively used in FIG. 13, and description thereof is omitted. FIG. 15 depicts a plan view, a front view, and a side view of the short stub 1310 (the same applies to FIG. 16). In the short stub 1310 depicted in FIG. 15, portions 1511, 1512, and 1513 of the first transmission path 1312 are cut out.

Electrodes 1521, 1522, and 1523 are provided near the portions 1511, 1512, and 1513 that have been cut out. The electrodes 1521, 1522, and 1523 are connected to the second transmission path 1313 by the vias 1531, 1532, and 1533, respectively.

FIG. 16 is a diagram for explaining adjustment of the short stub depicted in FIG. 15. From the state depicted in FIG. 15, the first transmission path 1312 is connected by a solder bridge 1611 where the portion 1511 has been cut out, as depicted in FIG. 16. Further, the first transmission path 1312 is connected by a solder bridge 1612 where the portion 1512 has been cut out. Furthermore, the transmission path on the end-1312a-side of a gap where the portion 1513 has been cut out, is connected to the electrode 1523 by a solder bridge 1613.

In this case, the end portion (the portion 1513) opposite to the end 1312a of the first transmission path 1312 is connected to the second transmission path 1313 via the via 1533. The voltage wave input from the end 1312a of the first transmission path 1312 is transmitted through the first transmission path 1312, reflected where the portion 1513 has been cut out, and returns to the end 1312a of the first transmission path 1312. Thus, the effective length L of the first transmission path 1312 can be increased.

Thus, the waveform shaping circuit 100 according to the second embodiment implements a speed up circuit that enhances the rising portion of the voltage waveform by the short stub 1310 that is free of the variation in the self-resonant frequency, thereby reducing the variation in the rise time of the current waveform caused by the variation in the self-resonant frequency of the speed up circuit.

Further, the voltage waveform can be enhanced during the period when the voltage wave shuttles along the first transmission path 1312. Thus, the period T during which the voltage waveform is enhanced can be lengthened, and the enhancement time T of the voltage waveform can be accurately adjusted by adjusting the length of the first transmission path 1312. Consequently, the rise of the waveform of the supplied current can be accurately shaped.

Similar to the waveform shaping circuit 100 according to the first embodiment, when the load 101 is an SOA used as an optical switch, an optical switching device having less variation in optical switching time can be achieved. Further, compared to the conventional waveform shaping circuit, the rise of the current that flows through the load 101 can be speeded up. Furthermore, the rise of the current that flows through an SOA can be speeded up even when the SOA has a slow rise characteristic of current with respect to the applied voltage.

As described above, according to the waveform shaping circuit and the optical switching device disclosed herein, the rise of the waveform of the supplied current can be accurately shaped. An SOA is taken as an example of the load 101 in the embodiments described above; however, the load 101 can be applied generally to load elements having reactance.

According to the above configuration, by implementing a speed up circuit that enhances the rising portion of the voltage waveform by a stub, variation in the rise time of the waveform of the applied voltage due to the variation in the self-resonant frequency of the speed up circuit can be reduced.

The waveform shaping circuit and the optical switching device described herein effect accurate shaping of the rise of the waveform of the applied voltage.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A waveform shaping circuit that enhances a rise of a waveform of a voltage applied to a load, comprising:
a first resistor connected to the load;
a second resistor connected to the load; and
a stub connected to the first resistor or the second resistor and including a transmission path of a given length configured to shuttle the voltage by transmitting and reflecting the voltage as a voltage wave, wherein the stub is an open stub connected in parallel with the first resistor and includes:
a dielectric substrate;
a first transmission path as the transmission path of the given length provided on the dielectric substrate and connected to one side of the first resistor, wherein a portion of the first transmission path is cut out; and
a second transmission path connected to one side of the second resistor and provided on the dielectric substrate so as to face the first transmission path with the dielectric substrate therebetween.

2. An optical switching device comprising:
a waveform shaping circuit according to claim 1; and
a semiconductor optical amplifier as the load, wherein the semiconductor optical amplifier is used as an optical switch.

3. The waveform shaping circuit according to claim 1, wherein the load is a semiconductor optical amplifier used as an optical switch.

4. The waveform shaping circuit according to claim 1, wherein a characteristic impedance of the stub is lower than a resistance of the first resistor.

5. The waveform shaping circuit according to claim 1, wherein an end of the first transmission path is connected to the one side of the first resistor, and
an end of the second transmission path facing the end of the first transmission path is connected to the one side of the second resistor.

6. The waveform shaping circuit according to claim 1, further comprising a connecting member that electrically connects the first transmission path where the portion has been cut out.

7. A waveform shaping circuit that enhances a rise of a waveform of a voltage applied to a load, comprising:
a first resistor connected to the load;
a second resistor connected to the load; and
a stub connected to the first resistor or the second resistor and including a transmission path of a given length configured to shuttle the voltage by transmitting and reflecting the voltage as a voltage wave, wherein the stub is a short stub connected in series with the second resistor and includes:
a dielectric substrate;
a first transmission path as the transmission path of the given length provided on the dielectric substrate and connected to the second resistor, wherein a portion of the first transmission path is cut out;
a second transmission path grounded and provided on the dielectric substrate so as to face the first transmission path with the dielectric substrate therebetween; and
a via provided on the dielectric substrate so as to connect the first transmission path and the second transmission path.

8. An optical switching device comprising:
a waveform shaping circuit according to claim 7; and
a semiconductor optical amplifier as the load, wherein the semiconductor optical amplifier is used as an optical switch.

9. The waveform shaping circuit according to claim 7, wherein the load is a semiconductor optical amplifier used as an optical switch.

10. The waveform shaping circuit according to claim 7, wherein a characteristic impedance of the stub is higher than a resistance of the second resistor.

11. The waveform shaping circuit according to claim 7, wherein an end of the first transmission path is connected to the second resistor,
an end of the second transmission path facing the end of the first transmission path is grounded, and
the via connects another end of the first transmission path opposite to the end of the first transmission path and another end of the second transmission path opposite to the end of the second transmission path.

12. The waveform shaping circuit according to claim 7, further comprising a connecting member that electrically connects the first transmission path where the portion has been cut out.

* * * * *